(12) United States Patent
Liu et al.

(10) Patent No.: US 8,090,121 B2
(45) Date of Patent: Jan. 3, 2012

(54) AUDIO ADAPTER HAVING VOLUME ADJUSTING FUNCTION

(75) Inventors: Chang-Chun Liu, Shenzhen (CN); Xiao-Lin Gan, Shenzhen (CN); Yu-Kuang Ho, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1056 days.

(21) Appl. No.: 11/953,875

(22) Filed: Dec. 11, 2007

(65) Prior Publication Data

US 2009/0110215 A1 Apr. 30, 2009

(30) Foreign Application Priority Data

Oct. 31, 2007 (CN) .......................... 2007 1 0202342

(51) Int. Cl.
*H03G 3/00* (2006.01)
(52) U.S. Cl. .......... 381/104; 381/109; 381/120; 381/28; 381/74; 700/94
(58) Field of Classification Search .................. 381/104, 381/109, 120, 28, 74; 700/94
See application file for complete search history.

(56) References Cited

U.S. PATENT DOCUMENTS

| | | | | |
|---|---|---|---|---|
| 5,330,512 A | * | 7/1994 | Hauck et al. | 607/28 |
| 5,483,581 A | * | 1/1996 | Hird et al. | 379/132 |
| 6,154,602 A | * | 11/2000 | Lee | 386/269 |
| 6,708,093 B2 | | 3/2004 | Totani et al. | |
| 7,539,301 B2 | * | 5/2009 | Bodo et al. | 379/414 |
| 2006/0245603 A1 | * | 11/2006 | Suzuki et al. | 381/104 |
| 2008/0079616 A1 | * | 4/2008 | Minobe | 341/143 |
| 2009/0010476 A1 | * | 1/2009 | Pan | 381/382 |

* cited by examiner

*Primary Examiner* — Kimberly Nguyen
*Assistant Examiner* — Mohammad T Karimy
(74) *Attorney, Agent, or Firm* — Altis Law Group, Inc.

(57) ABSTRACT

An audio adapter includes a first audio interface, a second audio interface, and two second amplifiers. The power pin of the second audio interface is connected to the non-inverting terminals of the two amplifiers. The left and right ear audio pins of the second audio interface are respectively connected to the inverting terminals of the first and the second amplifiers via two current-limiting resistors respectively. Two variable resistors are respectively connected between the inverting terminal and the output terminal of the two amplifiers. The output terminals of the two amplifiers are respectively connected to the left and right ear audio interface of the first audio interface and respectively connected to the ground pin of the first audio interface via two voltage-limiting resistors respectively.

9 Claims, 3 Drawing Sheets

AUDIO ADAPTER HAVING VOLUME ADJUSTING FUNCTION

CROSS-REFERENCES TO RELATED APPLICATION

Relevant subject matter is disclosed in co-pending U.S. Patent Application entitled "AUDIO ADAPTER HAVING VOLUME ADJUSTING FUNCTION" filed on Nov. 30, 2007 with application Ser. No. 11/947,779, and assigned to the same assignee as that of the present application.

BACKGROUND

1. Field of the Invention

The present invention relates to audio adapters, and particularly to an audio adapter which can adjust volume of an audio signal thereof.

2. Description of Related Art

Nowadays, earphone sets are already used in many audio devices, such as mobile telephones, MP3 players, etc. Earphone sets are designed with a lot of different types of interfaces, such as 2.5 mm/3.5 mm audio interface and universal serial bus (USB) audio interface. Thereby, some audio adapters are designed to adapt a device to accommodate these different types of audio interfaces.

However, these audio adapters can only transmit audio signals and have no other functions. When two users use an earphone set at the same time, each of them may want to use an earphone of the earphone set, they cannot adjust volume respectively, thereby the earphone set can not satisfy the two users at the same time, which is very inconvenient.

What is needed is to provide an audio adapter which has volume adjusting function.

SUMMARY

An embodiment of an audio adapter includes a first audio interface, a second audio interface, and two second amplifiers. The power pin of the second audio interface is connected to the non-inverting terminals of the two amplifiers. The left and right ear audio pins of the second audio interface are respectively connected to the inverting terminals of the first and the second amplifiers via two current-limiting resistors respectively. Two variable resistors are respectively connected between the inverting terminal and the output terminal of the two amplifiers. The output terminals of the two amplifiers are respectively connected to the left and right ear audio interface of the first audio interface and respectively connected to the ground pin of the first audio interface via two voltage-limiting resistors respectively.

Other advantages and novel features of the present invention will become more apparent from the following detailed description of an embodiment when taken in conjunction with the accompanying drawings, in which:

DETAILED DESCRIPTION

Figure 1:
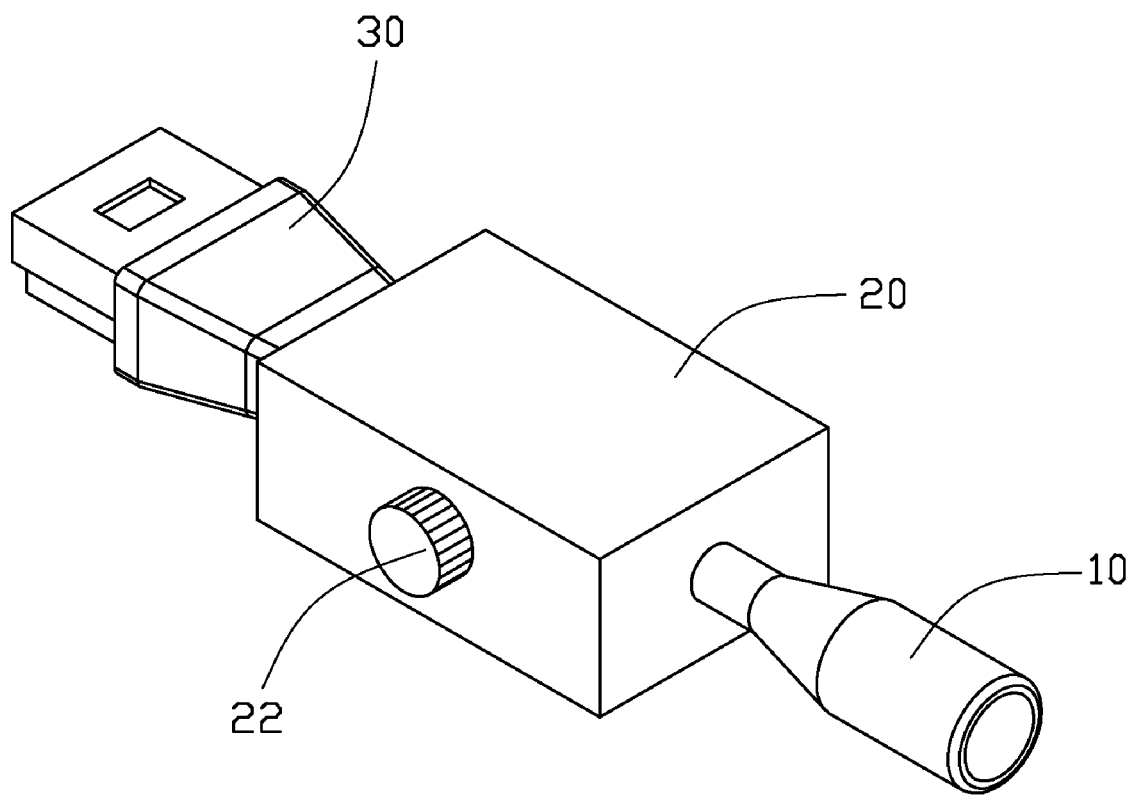
FIG. 1 is an isometric view of an audio adapter in accordance with an embodiment of the present invention.
Figure 2:
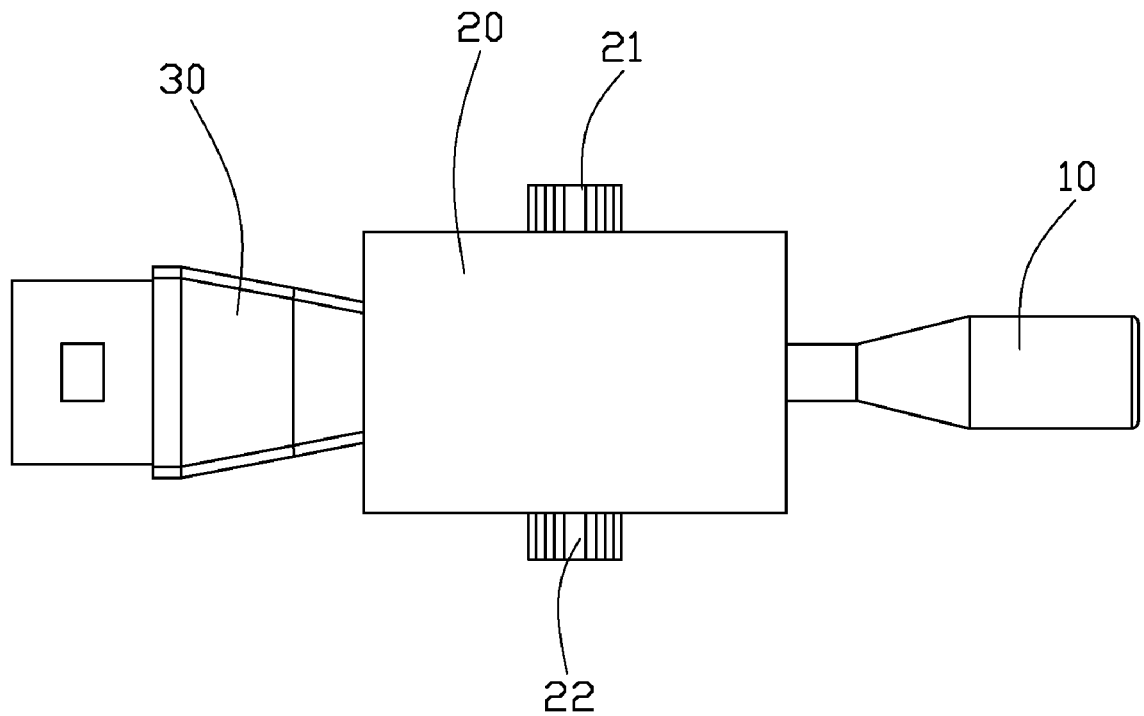
FIG. 2 is a top plan view of FIG. 1.
Figure 3:
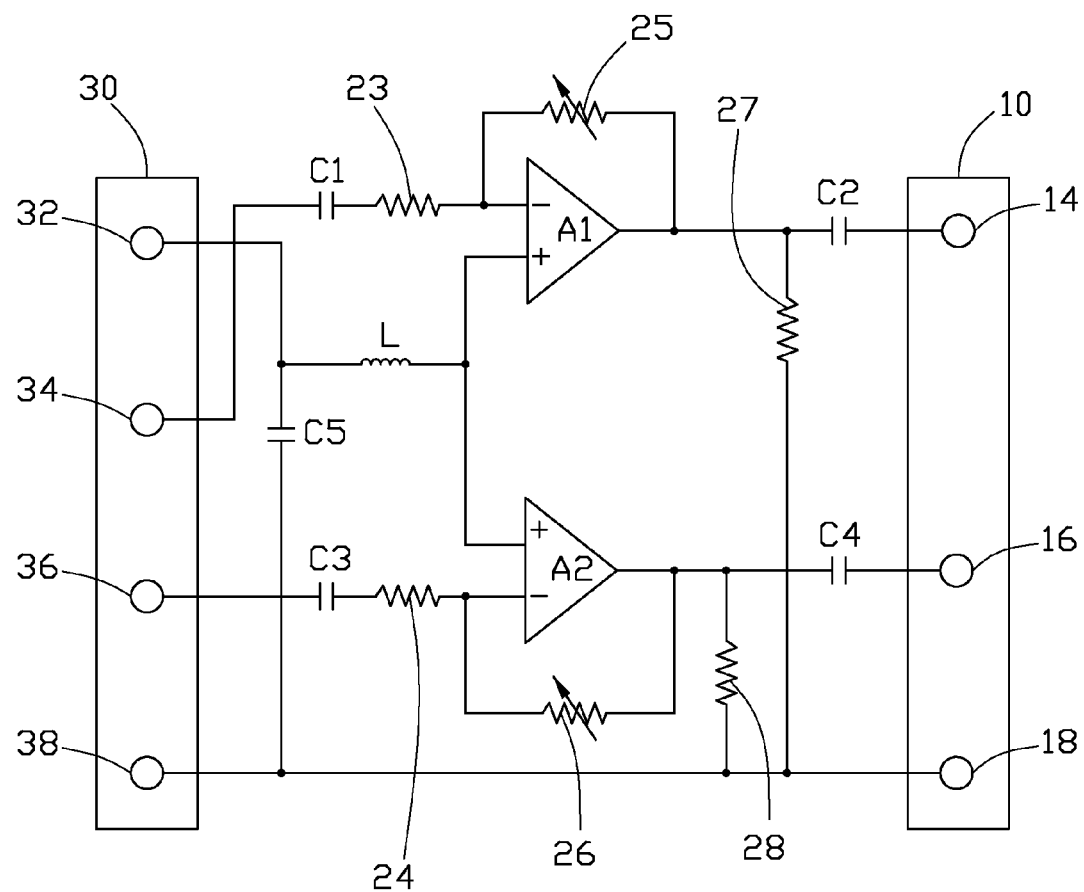
FIG. 3 is a circuit diagram of the audio adapter of FIG. 1.

Referring to FIGS. 1 to 3, an audio adapter in accordance with an embodiment of the present invention includes a first audio interface 10, a main body 20, a second audio interface 30, a first knob 21, a second knob 22, a first current-limiting resistor 23, a second current-limiting resistor 24, a first variable resistor 25, a second variable resistor 26, a first amplifier A1, a second amplifier A2, a first voltage-limiting resistor 27, a second voltage-limiting resistor 28, five capacitors C1~C5, and an inductor L. The resistance of the first current-limiting resistor 23, the second current-limiting resistor 24, the first variable resistor 25, and the second variable resistor 26 are respectively R1, R2, R3, and R4.

The first audio interface 10 includes a left ear audio pin 14, a right ear audio pin 16, and a ground pin 18. The second audio interface 30 includes a power pin 32, a left ear audio pin 34, a right ear audio pin 36, and a ground pin 38. In this embodiment, the first audio interface 10 is a 3.5 mm audio interface and the second audio interface 30 is a USB audio interface. The first audio interface 10 and the second audio interface 30 can be designed with other types of audio interfaces according to need.

The first audio interface 10 and the second audio interface 30 are respectively mounted on opposite ends of the main body 20. The first knob 21 and the second knob 22 are respectively mounted on opposite sides of the main body 20. The first variable resistor 25 and the second variable resistor 26 are installed in the main body 20. The first knob 21 is connected to an adjusting terminal of the first variable resistor 25 to adjust the resistance of the first variable resistor 25. The second knob 22 is connected to an adjusting terminal of the second variable resistor 26 to adjust the resistance of the second variable resistor 26.

The ground pin 18 of the first audio interface 10 is connected to the ground pin 38 of the second audio interface 30. The power pin 32 is connected to non-inverting terminals of the first amplifier A1 and the second amplifier A2 via the inductor L, and connected to the ground pin 38 of the second audio interface 30. The left ear audio pin 34 of the second audio interface 30 is connected to an inverting terminal of the first amplifier A1 via the capacitor C1 and the first current-limiting resistor 23 in turn. The first variable resistor 25 is connected between the inverting terminal and an output terminal of the first amplifier A1. The output terminal of the first amplifier A1 is connected to the left ear audio pin 14 of the first audio interface 10 via the capacitor C2, and connected to the ground pin 18 of the first audio interface 10 via the first voltage-limiting resistor 27. The right ear audio pin 36 of the second audio interface 30 is connected to an inverting terminal of the second amplifier A2 via the capacitor C3 and the second current-limiting resistor 24 in turn. The second variable resistor 26 is connected between the inverting terminal and an output terminal of the second amplifier A2. The output terminal of the second amplifier A2 is connected to the right ear audio pin 16 of the first audio interface 10 via the capacitor C4, and connected to the ground pin 18 of the first audio interface 10 via the second voltage-limiting resistor 28.

In this embodiment, the capacitors C1, C2, C3, and C4 are configured to filter direct current signals from the second audio interface 30 to the first audio interface 10. The first and second voltage resistors 27 and 28 are configured to fix the output voltage of the left and right ear audio pin 14 and 16 of the first audio interface 10 to satisfy audio output voltage standards. The capacitor C1 and inductor L are configured to filter the output voltage from the power pin 32 of the second audio interface 30. In other embodiments, the capacitors C1~C5 and inductor L can be deleted as a cost saving measure.

The first and second amplifier A1 and A2 are configured to amplify audio signals from the second audio interface 30 to the first audio interface 10. The gain of the first amplifier A1 is N1=R3/R1, and can be changed by adjusting the resistance R3 of the first variable resistor 25. The gain of the second amplifier A2 is N2=R4/R2, and can be changed by adjusting the resistance R4 of the second variable resistor 26.

In use, an audio interface of an earphone set is connected to the first audio interface 10. An audio interface of an audio device, such as a mobile telephone, is connected to the second audio interface 30. When the audio device transmits an audio signal, a power supply of the audio device supplies power to the first and second amplifier A1 and A2 via the power pin 32 of the second audio interface 30, and then the earphone set will receive the audio signal from the audio device. If two users use the earphone set at the same time, and each wants to use an earphone of the earphone set, they can adjust volume respectively via the first knob 21 and the second knob 22, which is very convenient.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An audio adapter comprising:
   a first audio interface having a left ear audio pin, a right ear audio pin, and a ground pin, wherein the first audio interface is an analog audio interface, the left ear audio pin and the right ear audio pin correspond to two sound channels of a stereo sound system;
   a second audio interface having a power pin, a left ear audio pin, a right ear audio pin, and a ground pin, wherein the second audio interface is a universal serial bus (USB) audio interface, the left ear audio pin and the right ear audio pin correspond to the two sound channels of the stereo sound system;
   a first amplifier having an inverting terminal, a non-inverting terminal, and an output terminal, the power pin of the second audio interface connected to the non-inverting terminal of the first amplifier, the left ear audio pin of the second audio interface connected to the inverting terminal of the first amplifier via a first current-limiting resistor, a first variable resistor connected between the inverting terminal and the output terminal of the first amplifier, the output terminal of the first amplifier connected to the left ear audio interface of the first audio interface and connected to the ground pin of the first audio interface via a first voltage-limiting resistor; and
   a second amplifier having an inverting terminal, a non-inverting terminal, and an output terminal, the power pin of the second audio interface connected to the non-inverting terminal of the second amplifier, the right ear audio pin of the second audio interface connected to the inverting terminal of the second amplifier via a second current-limiting resistor, a second variable resistor connected between the inverting terminal and the output terminal of the second amplifier, the output terminal of the second amplifier connected to the right ear audio interface of the first audio interface and connected to the ground pin of the first audio interface via a second voltage-limiting resistor.

2. The audio adapter as claimed in claim 1, wherein an inductor is connected between the power pin of the second audio interface and the non-inverting terminals of the first and second amplifiers, a capacitor is connected between the power pin and ground pin of the second audio interface.

3. The audio adapter as claimed in claim 1, wherein a capacitor is connected between the left ear audio pin of the second audio interface and the first current-limiting resistor.

4. The audio adapter as claimed in claim 1, wherein a capacitor is connected between the right ear audio pin of the second audio interface and the second current-limiting resistor.

5. The audio adapter as claimed in claim 1, wherein a capacitor is connected between the output terminal of the first amplifier and the left ear audio pin of the first audio interface.

6. The audio adapter as claimed in claim 1, wherein a capacitor is connected between the output terminal of the second amplifier and the right ear audio pin of the first audio interface.

7. The audio adapter as claimed in claim 1, wherein the first variable resistor and second variable resistor are installed in a main body having a first knob and a second knob mounted thereon, the first knob is connected to an adjusting terminal of the first variable resistor to adjust the resistance thereof, the second knob is connected to an adjusting terminal of the second variable resistor to adjust the resistance thereof.

8. The audio adapter as claimed in claim 7, wherein the first audio interface and the second audio interface are respectively mounted on opposite ends of the main body, the first knob and the second knob are respectively mounted on opposite sides of the main body.

9. The audio adapter as claimed in claim 1, wherein the first audio interface is a 3.5 mm audio interface.

* * * * *